United States Patent
Lo et al.

(10) Patent No.: US 10,979,069 B2
(45) Date of Patent: Apr. 13, 2021

(54) DELTA-SIGMA MODULATOR WITH TRUNCATION ERROR COMPENSATION AND ASSOCIATED METHOD

(71) Applicant: MEDIATEK INC., Hsin-Chu (TW)

(72) Inventors: Tien-Yu Lo, Hsin-Chu (TW); Chan-Hsiang Weng, Hsin-Chu (TW); Su-Hao Wu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/809,535

(22) Filed: Mar. 4, 2020

(65) Prior Publication Data
US 2020/0295776 A1    Sep. 17, 2020

Related U.S. Application Data

(60) Provisional application No. 62/818,167, filed on Mar. 14, 2019.

(51) Int. Cl.
*H03M 1/06* (2006.01)
*H03M 3/00* (2006.01)

(52) U.S. Cl.
CPC ......... *H03M 3/322* (2013.01); *H03M 3/426* (2013.01); *H03M 3/464* (2013.01)

(58) Field of Classification Search
CPC ............................. H03M 3/322; H03M 3/426
USPC ................... 341/143, 118, 120, 155, 144
See application file for complete search history.

(56) References Cited

U.S. PATENT DOCUMENTS

| | | | | |
|---|---|---|---|---|
| 7,450,047 | B1* | 11/2008 | Wu | H03M 3/412 |
| | | | | 341/143 |
| 9,490,835 | B2* | 11/2016 | Wang | H03M 3/37 |
| 2017/0353192 | A1 | 12/2017 | Tsai | |

FOREIGN PATENT DOCUMENTS

EP    3 280 055 A1    2/2018

OTHER PUBLICATIONS

Yu, A Low-Power Multi-Bit ΣΔ Modulator in 90-nm Digital CMOS Without DEM, IEEE Journal of Solid-State Circuits, pp. 2428-2436, vol. 40, No. 12, Dec. 2005.
Yu, A Low-Power Multi-Bit ΔΣ Modulator in 90nm Digital CMOS without DEM, pp. 168-169 and 591, ISSCC 2005 / Session 9 / Switched-Capacitor Δϕ Modulators / 9.2.
(Continued)

*Primary Examiner* — Peguy Jean Pierre
(74) *Attorney, Agent, or Firm* — Winston Hsu

(57) ABSTRACT

A delta-sigma modulator includes a first combining circuit, a loop filter circuit, a quantizer circuit, a truncator circuit, a first digital-to-analog converter (DAC) circuit, and a compensation circuit. The first combining circuit generates a first analog signal by combining an analog feedback signal and an analog input signal. The loop filter circuit generates a loop-filtered signal according to the first analog signal. The quantizer circuit outputs a first digital signal that is indicative of a digital combination result of at least a truncation error compensation signal and the loop-filtered signal. The truncator circuit performs truncation upon the first digital signal to generate a second digital signal. The first DAC circuit generates the analog feedback signal according to the second digital signal. The compensation circuit generates the truncation error compensation signal according to a truncation error resulting from truncation performed upon the first digital signal.

16 Claims, 7 Drawing Sheets

(56) References Cited

OTHER PUBLICATIONS

Hung-Chieh Tsai et al., A 64-fJ/Conv.-Step Continuous-Time ΣΔ Modulator in 40-nm CMOS Using Asynchronous SAR Quantizer and Digital ΔΣ Truncator, IEEE Journal of Solid-State Circuits, Nov. 2013, pp. 2637-2648, vol. 48, No. 11, IEEE, XP011531071.

Lin He et al., Digital Noise-Coupling Technique for Delta-Sigma Modulators With Segmented Quantization, IEEE Transactions on Circuits and Systems—II: Express Briefs, Jun. 2014, pp. 403-407, vol. 61, No. 6, IEEE, XP011551104.

Haiyue Yan et al., A second-order continuous-time delta-sigma modulator with double self noise coupling, Analog Integrated Circuits and Signal Processing, Feb. 20, 2019, pp. 251-259, vol. 99, Springer Science+Business Media, XP036767815.

\* cited by examiner

DELTA-SIGMA MODULATOR WITH TRUNCATION ERROR COMPENSATION AND ASSOCIATED METHOD

CROSS REFERENCE TO RELATED APPLICATIONS

This application claims the benefit of U.S. provisional application No. 62/818,167, filed on Mar. 14, 2019 and incorporated herein by reference.

BACKGROUND

The present invention relates to delta-sigma modulation, and more particularly, to a delta-sigma modulator with truncation error compensation and an associated method.

In a conventional delta-sigma modulator with a multi-bit quantizer, a multi-level digital-to-analog converter (DAC) is required to feed back an output signal of the delta-sigma modulator and to work with a loop filter and a quantizer to implement a closed-loop system for noise-shaping function. However, a mismatch between the DAC cells contributes mismatch errors. Since the digital input to the feedback DAC determines the selection of DAC cells included in the feedback DAC, these mismatches result in non-linearity in the analog output of the feedback DAC. A dynamic element matching (DEM) function is a well-known strategy to address the mismatch issue of the multi-level feedback DAC, but the hardware complexity grows exponentially as a bit number of the feedback DAC increases. Thus, there is a need for an innovative feedback DAC reduction technique in a delta-sigma modulator.

SUMMARY

One of the objectives of the claimed invention is to provide a delta-sigma modulator with truncation error compensation and an associated method.

According to a first aspect of the present invention, an exemplary delta-sigma modulator is disclosed. The exemplary delta-sigma modulator includes a first combining circuit, a loop filter circuit, a quantizer circuit, a truncator circuit, a first digital-to-analog converter (DAC) circuit, and a compensation circuit. The first combining circuit is arranged to receive an analog input signal and an analog feedback signal, and generate a first analog signal by combining the analog feedback signal and the analog input signal. The loop filter circuit is arranged to receive the first analog signal, and generate a loop-filtered signal according to the first analog signal. The quantizer circuit is arranged to output a first digital signal that is indicative of a digital combination result of at least a truncation error compensation signal and the loop-filtered signal. The truncator circuit is arranged to perform truncation upon the first digital signal to generate a second digital signal, wherein a bit number of the second digital signal is smaller than a bit number of the first digital signal. The first DAC circuit is arranged to receive the second digital signal, and generate the analog feedback signal according to the second digital signal. The compensation circuit is arranged to generate the truncation error compensation signal according to a truncation error resulting from said truncation performed upon the first digital signal.

According to a second aspect of the present invention, an exemplary delta-sigma modulation method is disclosed. The exemplary delta-sigma modulation method includes: generating a first analog signal by combining an analog feedback signal and an analog input signal; generating a loop-filtered signal by applying loop filtering to the first analog signal; performing quantization to output a first digital signal that is indicative of a digital combination result of at least a truncation error compensation signal and the loop-filtered signal; performing truncation upon the first digital signal to generate a second digital signal, wherein a bit number of the second digital signal is smaller than a bit number of the first digital signal; performing digital-to-analog conversion upon the second digital signal to generate the analog feedback signal; and generating the truncation error compensation signal according to a truncation error resulting from said truncation performed upon the first digital signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
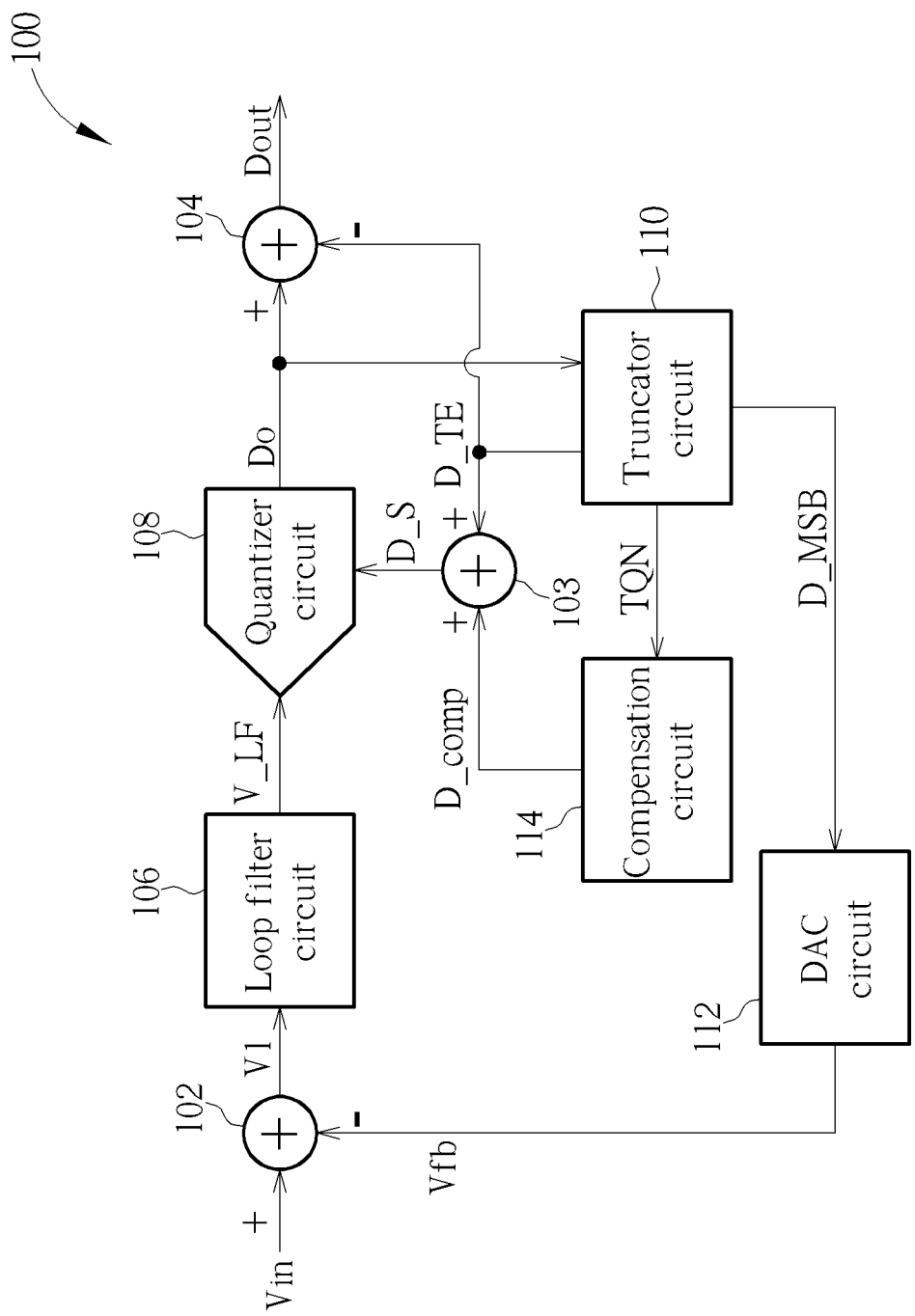
FIG. 1 is a diagram illustrating a first delta-sigma modulator according to an embodiment of the present invention.

FIG. 1 is a diagram illustrating a first delta-sigma modulator according to an embodiment of the present invention. By way of example, but not limitation, the delta-sigma modulator 100 may be a part of a delta-sigma analog-to-digital converter (ADC). For example, an analog input signal Vin of the delta-sigma modulator 100 may be an analog input of the delta-sigma ADC, and a digital output of the delta-sigma ADC may be generated by processing a digital output signal Dout of the delta-sigma modulator 100 through a digital filter and a decimation filter. As shown in FIG. 1, the delta-sigma modulator 100 includes a plurality of combining circuits 102, 103, 104, a loop filter circuit 106, a quantizer circuit 108, a digital-to-analog converter (DAC) circuit 112, a truncator circuit 110, and a compensation circuit 114. The combining circuit 102 is arranged to receive the analog input signal Vin and an analog feedback signal Vfb, and generate an analog signal V1 by combining the analog feedback signal Vfb and the analog input signal Vin. For example, the combining circuit 102 outputs a voltage difference between the analog signal V1 and the analog feedback signal Vfb as the analog signal V1 (i.e., V1=Vin−Vfb). The loop filter circuit is arranged to receive the analog signal V1, and generate a loop-filtered signal V_LF according to the analog signal V1. For example, the loop filter circuit 106 may be implemented by an integrator with a transfer function $$H(z) = \frac{z^{-1}}{1+z^{-1}}.$$

The quantizer circuit 108 is arranged to perform quantization to output a digital signal Do that is indicative of a digital combination result of a truncation error compensation signal D_comp (which is a digital signal), a truncation error signal D_TE (which is a digital signal), and the loop-filtered signal V_LF (which is an analog signal). The truncator circuit 110 is arranged to perform truncation upon the digital signal Do to generate a digital signal D_MSB, wherein a bit number of the digital signal D_MSB is smaller than a bit number of the digital signal Do. The truncator circuit 110 and the DAC circuit 112 are located at a feedback path between the quantizer circuit 108 and the combining circuit 102. Hence, the DAC circuit 112 is arranged to receive the digital signal D_MSB, and generate the analog feedback signal Vfb according to the digital signal D_MSB. The compensation circuit 114 is arranged to generate the truncation error compensation signal D_comp according to a truncation error TQN resulting from the truncation performed upon the digital signal Do.

Figure 2:
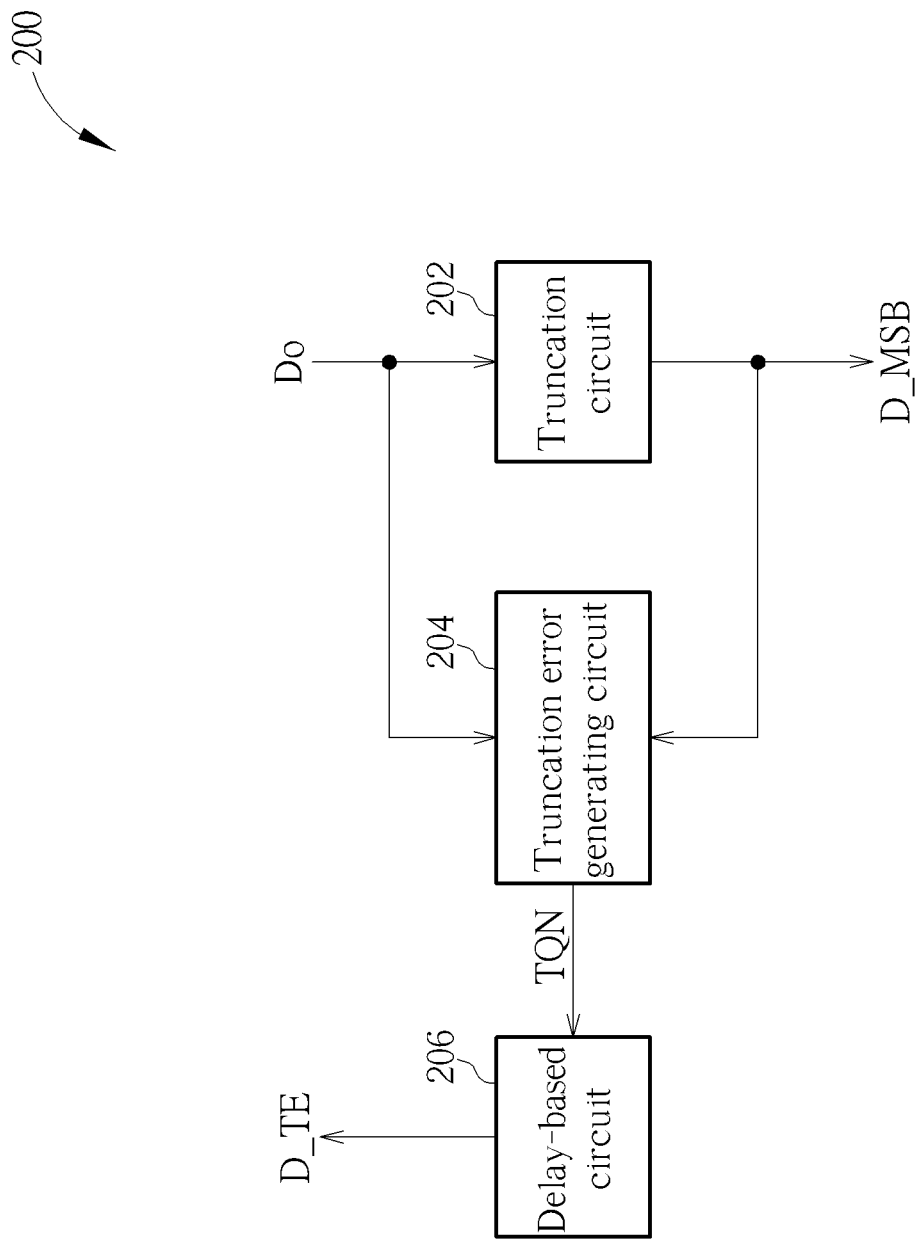
FIG. 2 is a diagram illustrating a truncator circuit according to an embodiment of the present invention.

In this embodiment, the truncator circuit 110 may be implemented by a delta-sigma truncator with truncator error shaping. FIG. 2 is a diagram illustrating a truncator circuit according to an embodiment of the present invention. The truncator circuit 110 shown in FIG. 1 may be realized by the truncator circuit 200 shown in FIG. 2. The truncator circuit 200 includes a truncation circuit 202, a truncation error generating circuit 204, and a delay-based circuit 206. The truncation circuit 202 truncates the digital signal Do (e.g., N-bit digital word) to generate the digital signal D_MSB (e.g., M-bit digital word, where N>M). The truncation error generating circuit 204 generates the truncation error TQN according to the digital signals Do and D_MSB. For example, the truncation error generating circuit 204 generates the truncation error TQN by subtracting the digital signal D_MSB from the digital signal Do. In this example, the digital signal D_MSB may be an M-bit most significant bit (MSB) part of the N-bit digital signal Do, and the truncation error TQN may be an (N−M)-bit less significant bit (LSB) part of the N-bit digital signal Do. The delay-based circuit 206 outputs the truncation error signal D_TE according to the truncation error TQN. For example, the truncator circuit 200 may be a first-order digital delta-sigma truncator when the delay-based circuit 206 has a transfer function "$z^{-1}$" in a z-domain. For another example, the truncator circuit 200 may be a second-order digital delta-sigma truncator when the delay-based circuit 206 has a transfer function "$a*z^{-1}+b*z^{-2}$" in a z-domain.

Figure 3:
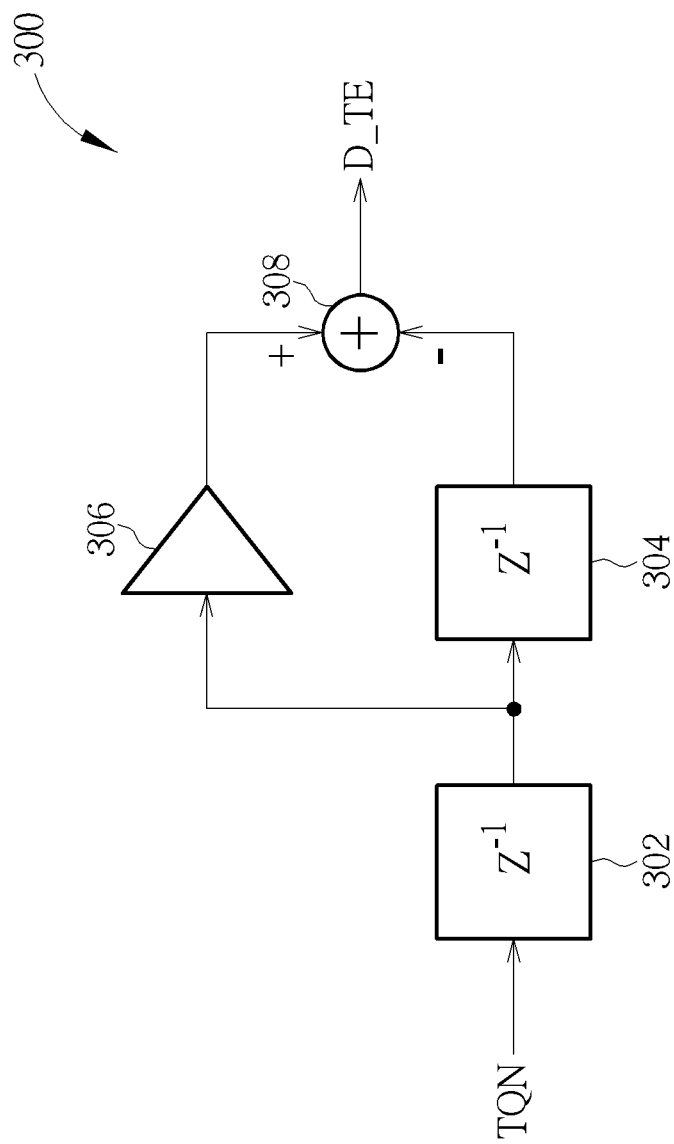
FIG. 3 is a diagram illustrating a delayed-based circuit according to an embodiment of the present invention.

FIG. 3 is a diagram illustrating a delayed-based circuit according to an embodiment of the present invention. The delay-based circuit 206 shown in FIG. 2 may be implemented by the delayed-based circuit 300 shown in FIG. 3, such that the truncator circuit 200 may be configured to act as a second-order digital delta-sigma truncator. As shown in FIG. 3, the delayed-based circuit 300 includes a plurality of delay circuits 302, 304, a multiplier 306, and a combining circuit 308. The truncation error TQN is fed into the delay circuit 302. An output of the delay circuit 302 is fed into the multiplier 306 and the delay circuit 304. The combining circuit 308 may be an adder that is configured to perform subtraction. Hence, the truncation error signal D_TE may be generated from subtracting a digital output of the delay circuit 304 from a digital output of the multiplier 306.

The combining circuit 104 of the delta-sigma modulator 100 is arranged to receive the digital signal Do and the truncation error signal D_TE, and generate the digital output signal Dout by combining the truncation error signal D_TE and the digital signal Do. As mentioned above, the quantizer circuit 108 outputs the digital signal Do that is indicative of a digital combination result of truncation error compensation signal D_comp, truncation error signal D_TE, and loop-filtered signal V_LF. Since the truncation error signal D_TE is injected to a forward path at which the quantizer circuit 108 is located rather than injected to a feedback path at which the truncator circuit 110 is located, the delta-sigma modulator 100 has the combining circuit 104 that is arranged to subtract the truncation error signal D_TE from the digital signal Do to generate the digital output signal Dout (i.e., Dout=Do−D_TE). For example, the combining circuit 104 may be an adder that is configured to perform subtraction.

The quantizer circuit 108 outputs the digital signal Do that is indicative of a digital combination result of truncation error compensation signal D_comp, truncation error signal D_TE, the loop-filtered signal V_LF. It should be noted that the loop-filtered signal V_LF is an analog signal, while the truncation error compensation signal D_comp and the truncation error signal D_TE are digital signals. In this embodiment, the combining circuit 103 is arranged to combining the truncation error compensation signal D_comp and the truncation error signal D_TE to generate a digital signal D_S. For example, the digital signal D_S is a summation result generated by adding the truncation error compensation signal D_comp to the truncation error signal D_TE. In this embodiment, the quantizer circuit 108 includes a successive approximation register (SAR) based quantizer with an internal DAC. Hence, the digital signal D_S can be merged into digital control of the internal DAC of the quantizer circuit 108.

Figure 4:
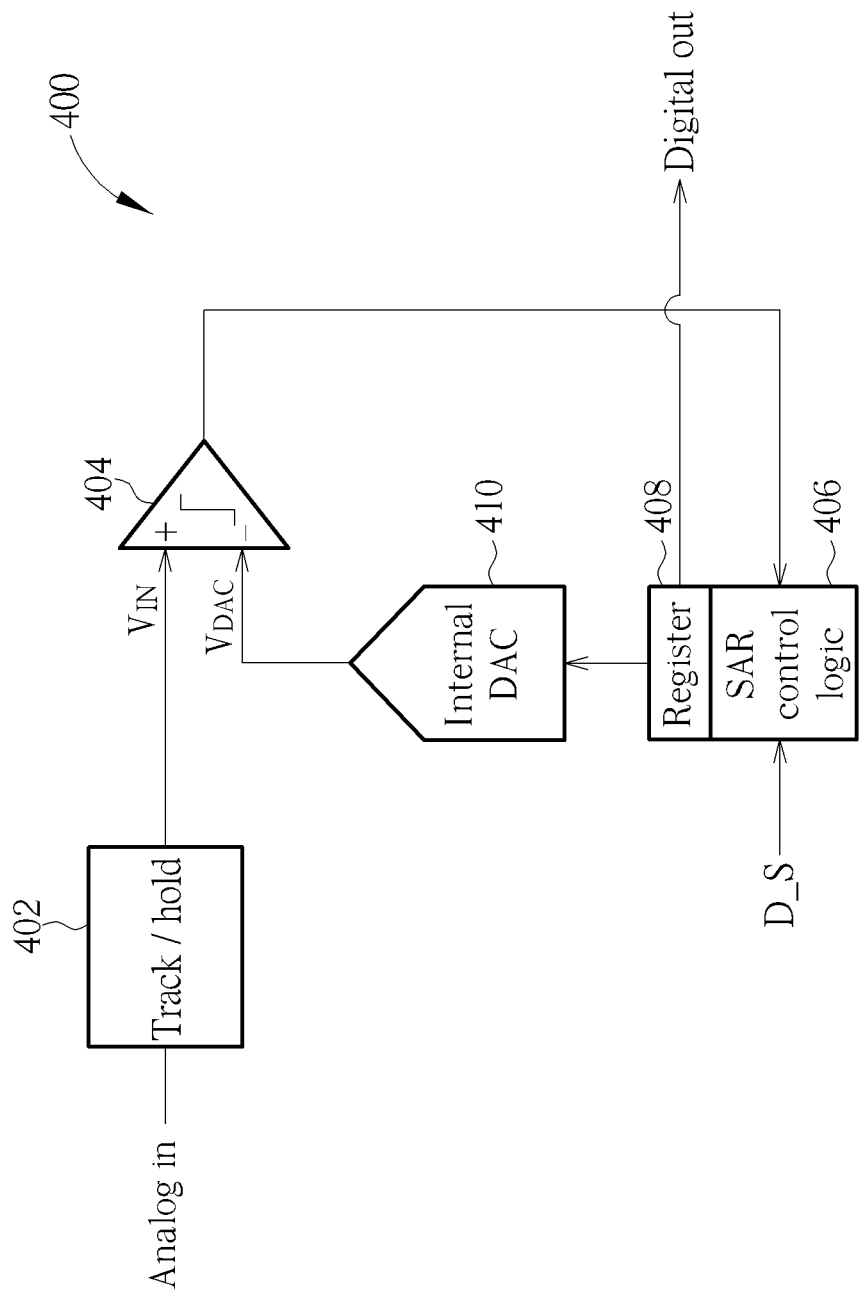
FIG. 4 is a diagram illustrating a SAR quantizer without noise shaping according to an embodiment of the present invention.

FIG. 4 is a diagram illustrating a SAR quantizer without noise shaping according to an embodiment of the present invention. The quantizer circuit 108 shown in FIG. 1 may be implemented using the SAR quantizer 400 shown in FIG. 4. The SAR quantizer 400 includes a track/hold circuit 402, a comparator 404, a SAR control logic 406, a register 408, and an internal DAC 410. The track/hold circuit 402 may be controlled according to a sampling frequency. Hence, an analog input voltage $V_{IN}$ is sampled and held on the track/hold circuit 402. A reference voltage $V_{DAC}$ is provided from the internal DAC 410 in response to a digital code stored in the register 408, where bits of the digital code is set and adjusted by the SAR control logic 406 according to a comparison result generated from the comparator 404 during an analog-to-digital conversion process. After the conversion of the analog input voltage $V_{IN}$ is complete, the digital word stored in the register 408 is output. As shown in FIG.

4, the SAR control logic 406 further receives the digital signal D_S that is derived from combining the truncation error signal D_TE and the truncation error compensation signal D_comp. Hence, the digital signal D_S is merged into digital control of the internal DAC 410. Though the comparator 404 receives the analog input voltage $V_{IN}$, the digital output of the SAR quantizer 400 is equal to a result of applying analog-to-digital conversion to an analog input voltage derived from combining the analog input voltage $V_{IN}$ and an analog voltage representative of the digital signal D_S.

It should be noted that the SAR quantizer architecture shown in FIG. 4 is for illustrative purposes only, and is not meant to be a limitation of the present invention. For example, the quantizer circuit 108 may be implemented by noise-shaping (NS-SAR) quantizer architecture. To put it simply, the present invention has no limitations on the SAR quantizer architecture employed by the quantizer circuit 108.

Figure 5:
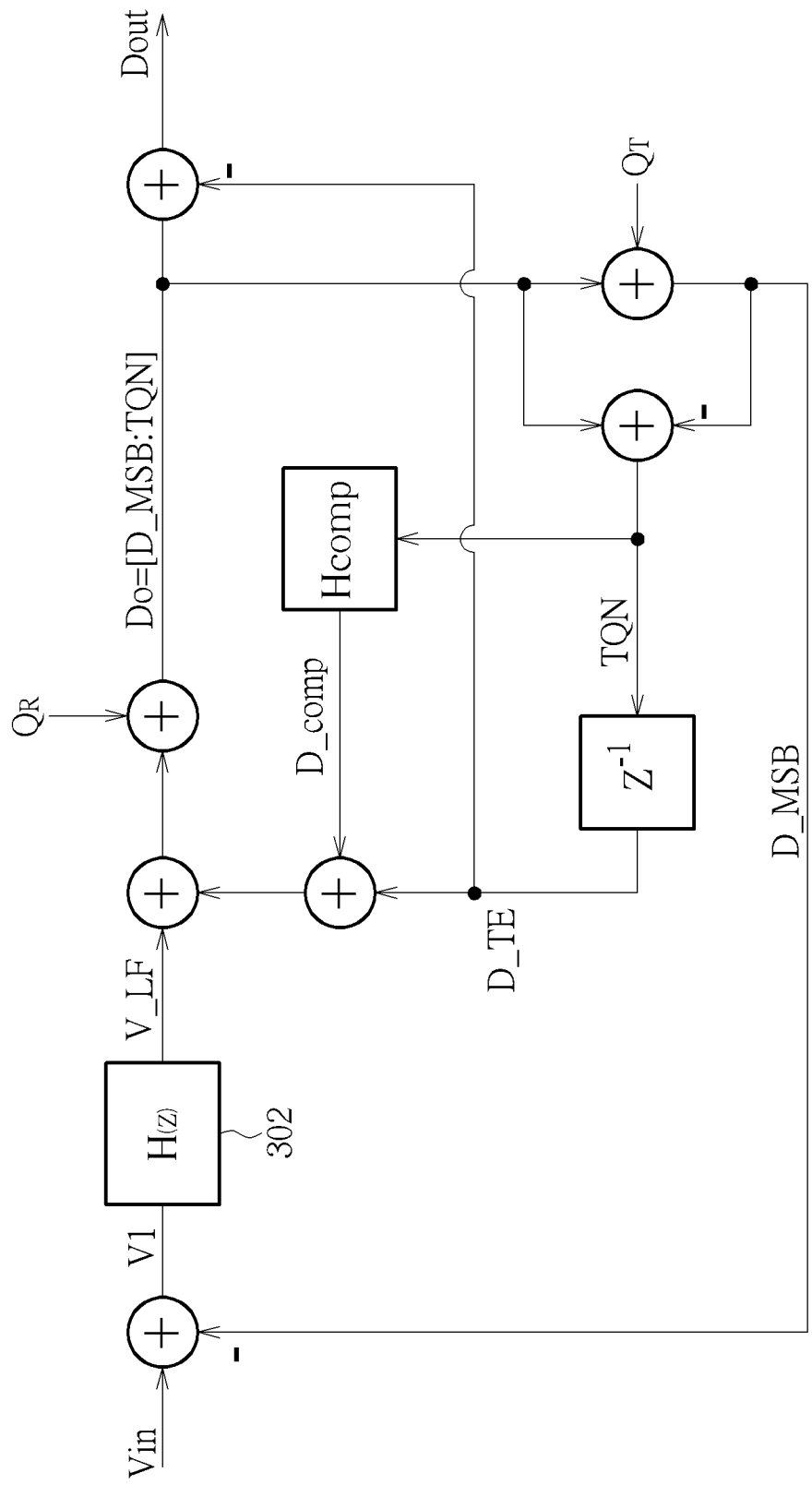
FIG. 5 is a diagram illustrating a simplified model of the delta-sigma modulator shown in FIG. 1.

FIG. 5 is a diagram illustrating a simplified model of the delta-sigma modulator 100 shown in FIG. 1. For clarity and simplicity, it is assumed that the truncator circuit 110 is implemented by a first-order digital delta-sigma modulator with a transfer function "$z^{-1}$" in the z-domain. Hence, a noise transfer function (NTF) of the truncator circuit 110 may be simply expressed by $(1-z^{-1})$. The quantization error $Q_R$ is induced by the quantizer circuit 108. The truncation error $Q_T$ (TQN=$Q_T$) is introduced by the truncator circuit 110, where an MSB part of the digital signal Do is processed via a feedback path, and an LSB part of the digital signal Do is processed via a compensation path. To achieve truncation error cancellation, the compensation circuit 114 is arranged to generate the truncation error compensation signal D_comp according to the truncation error TQN and a transfer function Hcomp, where the transfer function Hcomp is set on the basis of the NTF of the delta-sigma truncator and a transfer function H(z) of the loop filter circuit 106. For example, Hcomp=$-(1-z^{-1})*H(z)$. With a proper setting of the transfer function Hcomp of the compensation circuit 114, the truncation error $Q_T$ can be suppressed in the digital output signal Dout. For example, Dout=$STF_{DSM}*V_{IN}$+$NTF_{DSM}*Q_R$, where $STF_{DSM}$ represents a signal transfer function of the delta-sigma modulator 100, and $NTF_{DSM}$ represents a noise transfer function of the delta-sigma modulator 100.

Figure 6:
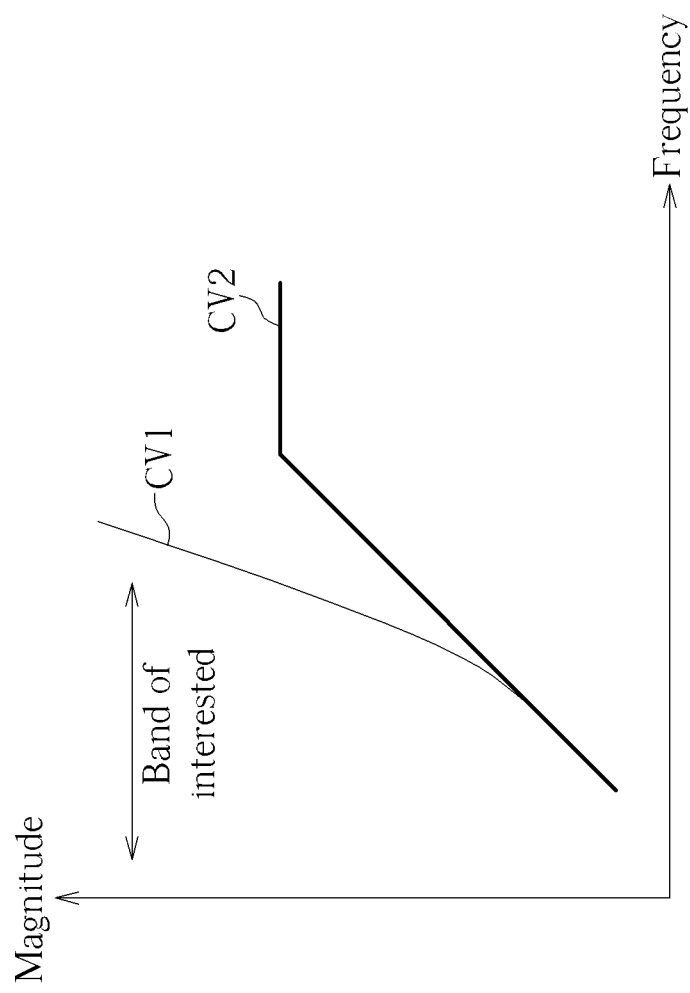
FIG. 6 is a diagram illustrating a frequency response of a noise transfer function of a delta-sigma modulator.

FIG. 6 is a diagram illustrating a frequency response of a noise transfer function of a delta-sigma modulator. When no truncation error compensation is employed by a delta-sigma modulator with feedback truncation, a noise transfer function of the delta-sigma modulator has a characteristic curve CV1 that is deviated from an ideal characteristic curve CV2. Regarding the proposed delta-sigma modulator 100, the compensation circuit 114 generates the compensation signal D_comp for truncation noise cancellation. Hence, with a proper setting of the transfer function Hcomp of the compensation circuit 114, a noise transfer function of the delta-sigma modulator 100 can be close to or identical to the ideal characteristic curve CV2.

As shown in FIG. 5, generation of the digital signal D_MSB only requires processing of the digital signal Do at the truncator circuit 110 (particularly, truncation circuit 202 shown in FIG. 2). That is, an additional combining circuit (e.g., an adder) is not needed by the feedback path for combining the truncation error signal D_TE and an input of the truncator circuit 110. In addition, an additional combining circuit (e.g., an adder) is not needed by the feedforward path for combining the truncation error compensation signal D_comp and an output of the quantizer circuit 108. In this way, the proposed delta-sigma modulator 100 can operate at a higher speed due to shorter loop latency, and the digital hardware of the proposed delta-sigma modulator 100 can be simplified.

The truncation error signal D_TE is not injected to a feedback path, and/or the compensation signal D_comp is not combined with an output of the quantizer circuit 108. In a case where the quantizer circuit 108 is implemented by a SAR-based quantizer (e.g., SAR quantizer with/without noise shaping), the digital signal injection can be merged in the SAR-based quantizer, thereby reducing the hardware cost. However, this is for illustrative purposes only, and is not meant to be a limitation of the present invention. Alternatively, a quantizer circuit may be implemented by a non-SAR-based quantizer. The same objective of shorting the loop latency and/or simplifying the digital hardware can be achieved.

Figure 7:
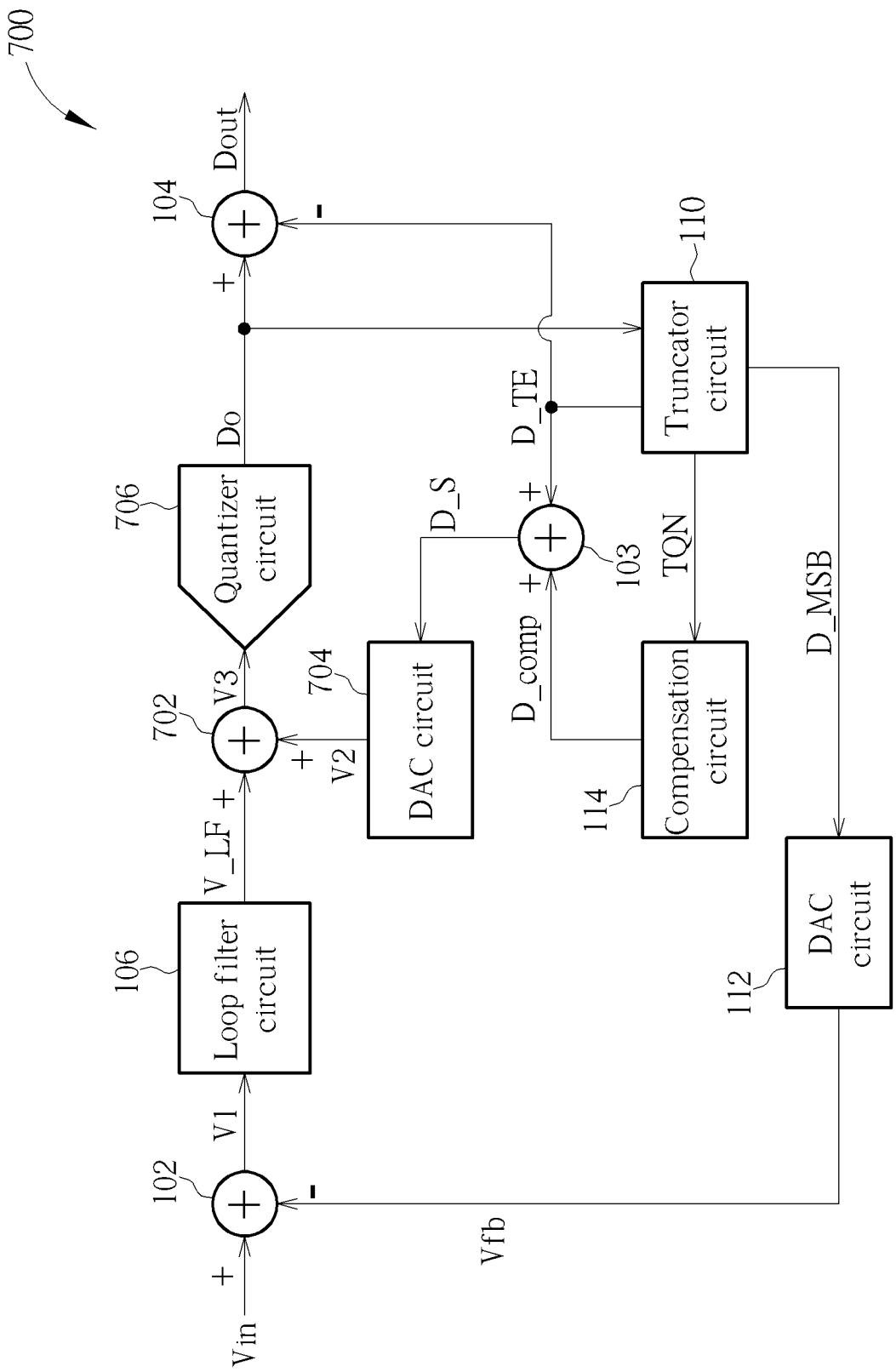
FIG. 7 is a diagram illustrating a second delta-sigma modulator according to an embodiment of the present invention.

FIG. 7 is a diagram illustrating a second delta-sigma modulator according to an embodiment of the present invention. The major difference between the delta-sigma modulators 100 and 700 is that the delta-sigma modulator 700 employs a non-SAR-based quantizer as a quantization circuit 706, and further includes a combining circuit 702 and a DAC circuit 704. The DAC circuit 704 is arranged to receive the digital signal D_S (which is derived from combining the truncation error signal D_TE and the truncation error compensation signal D_comp), and generates an analog signal V2 according to the digital signal D_S. The combining circuit 702 is arranged to receive the loop-filtered signal V_LF and the analog signal V2, and generate an analog signal V3 by combining the loop-filtered signal V_LF and the analog signal V2. That is, V3=V_LF+V2. Like the quantizer circuit 108, the quantizer circuit 706 is arranged to output the digital signal Do that is indicative of a digital combination result of truncation error compensation signal D_TE, truncation error compensation signal D_comp and the loop-filtered signal V_LF. In this embodiment, the quantizer circuit 706 receives the analog signal V3 (which is indicative of an analog combination result of truncation error compensation signal D_TE, truncation error compensation signal D_comp and the loop-filtered signal V_LF), and generates the digital signal Do according to the analog signal V3. The delta-sigma modulator 700 may have the same simplified model as shown in FIG. 5. Hence, the proposed delta-sigma modulator 700 can operate at a higher speed due to shorter loop latency.

In above embodiments shown in FIG. 1 and FIG. 7, the truncator circuit 110 may be implemented by a delta-sigma truncator with truncator error shaping. However, these are for illustrative purposes only, and are not meant to limitations of the present invention. In practice, any delta-sigma modulator design using the proposed concept that does not combine a truncation error compensation signal at an output of a quantizer circuit falls within the scope of the present invention. For example, a quantizer circuit outputs a digital signal that is indicative of a digital combination result of at least a truncation error compensation signal and a loop-filtered signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delta-sigma modulator comprising:
    a first combining circuit, arranged to receive an analog input signal and an analog feedback signal, and generate a first analog signal by combining the analog feedback signal and the analog input signal;
    a loop filter circuit, arranged to receive the first analog signal, and generate a loop-filtered signal according to the first analog signal;
    a quantizer circuit, arranged to output a first digital signal that is indicative of a digital combination result of at least a truncation error compensation signal and the loop-filtered signal;
    a truncator circuit, arranged to perform truncation upon the first digital signal to generate a second digital signal, wherein a bit number of the second digital signal is smaller than a bit number of the first digital signal;
    a first digital-to-analog converter (DAC) circuit, arranged to receive the second digital signal, and generate the analog feedback signal according to the second digital signal; and
    a compensation circuit, arranged to generate the truncation error compensation signal according to a truncation error resulting from said truncation performed upon the first digital signal, wherein the truncation error corresponds to a difference between the first digital signal and the second digital signal.

2. The delta-sigma modulator of claim 1, wherein the quantizer circuit outputs the first digital signal that is indicative of the digital combination result of the truncation error compensation signal, the loop-filtered signal, and a truncation error signal, and the truncator circuit is further arranged to generate the truncation error signal according to the truncation error.

3. The delta-sigma modulator of claim 2, further comprising:
    a second combining circuit, arranged to receive the first digital signal and the truncation error signal, and generate a digital output signal by combining the truncation error signal and the first digital signal.

4. The delta-sigma modulator of claim 3, wherein the digital output signal is generated by subtracting the truncation error signal from the first digital signal.

5. The delta-sigma modulator of claim 2, wherein the truncator circuit is a delta-sigma truncator.

6. The delta-sigma modulator of claim 5, wherein the compensation circuit generates the truncation error compensation signal according to the truncation error and a transfer function of the compensation circuit, and the transfer function of the compensation circuit depends on a noise transfer function of the delta-sigma truncator and a transfer function of the loop filter circuit.

7. The delta-sigma modulator of claim 1, further comprising:
    a second combining circuit, arranged to receive the truncation error signal and the truncation error compensation signal, and generate a third digital signal by combining at least the truncation error signal and the truncation error compensation signal;
    wherein the quantizer circuit comprises a successive approximation register (SAR) based quantizer with an internal DAC, and the third digital signal is merged into digital control of the internal DAC.

8. The delta-sigma modulator of claim 1, further comprising:
    a second combining circuit, arranged to receive the truncation error signal and the truncation error compensation signal, and generate a third digital signal by at least combining the truncation error signal and the truncation error compensation signal; and
    a second DAC circuit, arranged to receive the third digital signal, and generate a second analog signal according to the third digital signal; and
    a third combining circuit, arranged receive the second analog signal and the loop-filtered signal, and generate a third analog signal by combining the second analog signal and the loop-filtered signal;
    wherein the quantizer circuit receives the third analog signal, and generates the first digital signal according to the third analog signal.

9. A delta-sigma modulation method comprising:
    generating a first analog signal by combining an analog feedback signal and an analog input signal;
    generating a loop-filtered signal by applying loop filtering to the first analog signal;
    performing quantization to output a first digital signal that is indicative of a digital combination result of at least a truncation error compensation signal and the loop-filtered signal;
    performing truncation upon the first digital signal to generate a second digital signal, wherein a bit number of the second digital signal is smaller than a bit number of the first digital signal;
    performing digital-to-analog conversion upon the second digital signal to generate the analog feedback signal; and
    generating the truncation error compensation signal according to a truncation error resulting from said truncation performed upon the first digital signal, wherein the truncation error corresponds to a difference between the first digital signal and the second digital signal.

10. The delta-sigma modulation method of claim 9, further comprising:
    generating a truncation error signal according to the truncation error;
    wherein the first digital signal is indicative of the digital combination result of the truncation error compensation signal, the loop-filtered signal, and the truncation error signal.

11. The delta-sigma modulation method of claim 10, further comprising:
    generating a digital output signal by combining the truncation error signal and the first digital signal.

12. The delta-sigma modulation method of claim 11, wherein the digital output signal is generated by subtracting the truncation error signal from the first digital signal.

13. The delta-sigma modulation method of claim 10, wherein the truncation error signal and the second digital signal are generated from delta-sigma truncation.

14. The delta-sigma modulation method of claim 13, wherein the truncation error compensation signal is generated according to the truncation error and a transfer function of truncation error compensation, and the transfer function of truncation error compensation depends on a noise transfer function of said delta-sigma truncation and a transfer function of said loop filtering.

15. The delta-sigma modulation method of claim 9, further comprising:
    generating a third digital signal by combining at least the truncation error signal and the truncation error compensation signal;
    wherein said quantization is performed by a successive approximation register (SAR) based quantizer with an internal DAC, and the third digital signal is merged into digital control of the internal DAC.

16. The delta-sigma modulation method of claim 9, further comprising:

generating a third digital signal by combining at least the truncation error signal and the truncation error compensation signal; and performing digital-to-analog conversion upon the third digital signal to generate a second analog signal; and generating a third analog signal by combining the second analog signal and the loop-filtered signal;

wherein performing quantization to output the first digital signal comprises:

generating the first digital signal by performing said quantization upon the third analog signal.

* * * * *